United States Patent
Ng et al.

(10) Patent No.: US 8,586,436 B2
(45) Date of Patent: Nov. 19, 2013

(54) METHOD OF FORMING A VARIETY OF REPLACEMENT GATE TYPES INCLUDING REPLACEMENT GATE TYPES ON A HYBRID SEMICONDUCTOR DEVICE

(75) Inventors: Jin-Aun Ng, Hsinchu (TW); Ming Zhu, Singapore (SG); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/424,935

(22) Filed: Mar. 20, 2012

(65) Prior Publication Data

US 2013/0249010 A1    Sep. 26, 2013

(51) Int. Cl.
    *H01L 21/8234*    (2006.01)
(52) U.S. Cl.
    USPC ........... 438/275; 438/183; 438/199; 438/587; 257/369
(58) Field of Classification Search
    USPC .................. 438/587, 183, 199, 275; 257/369
    See application file for complete search history.

(56) References Cited

U.S. PATENT DOCUMENTS

| | | | |
|---|---|---|---|
| 8,324,118 B2* | 12/2012 | Liu et al. | 438/785 |
| 2003/0049919 A1* | 3/2003 | Yamamoto | 438/592 |
| 2009/0087956 A1* | 4/2009 | Rao et al. | 438/233 |
| 2010/0173470 A1* | 7/2010 | Lee et al. | 438/427 |
| 2011/0156154 A1* | 6/2011 | Hoentschel et al. | 257/369 |

\* cited by examiner

*Primary Examiner* — William F Kraig
*Assistant Examiner* — Gardner W Swan
(74) *Attorney, Agent, or Firm* — Haynes and Boone, LLP

(57) ABSTRACT

Provided is a method and device that includes providing for a plurality of differently configured gate structures on a substrate. For example, a first gate structure associated with a transistor of a first type and including a first dielectric layer and a first metal layer; a second gate structure associated with a transistor of a second type and including a second dielectric layer, a second metal layer, a polysilicon layer, the second dielectric layer and the first metal layer; and a dummy gate structure including the first dielectric layer and the first metal layer.

10 Claims, 17 Drawing Sheets

METHOD OF FORMING A VARIETY OF REPLACEMENT GATE TYPES INCLUDING REPLACEMENT GATE TYPES ON A HYBRID SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement or "gate last" process in which the final gate stack is fabricated "last" which allows for reduced number of subsequent processes, including high temperature processing, that must be performed after formation of the gate. There are challenges to implementing such features and processes in CMOS fabrication however. These challenges increase for devices having different types of gate structures on a single substrate.

Thus, what is desired is a method of fabricating a semiconductor device having differently configured gate structures implementing a replacement gate methodology.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further, to the extent that the present disclosure provides examples of planar transistors, one of ordinary skill in the art would recognize its applicability to multi-gate devices such as finFET devices.

Figure 1:
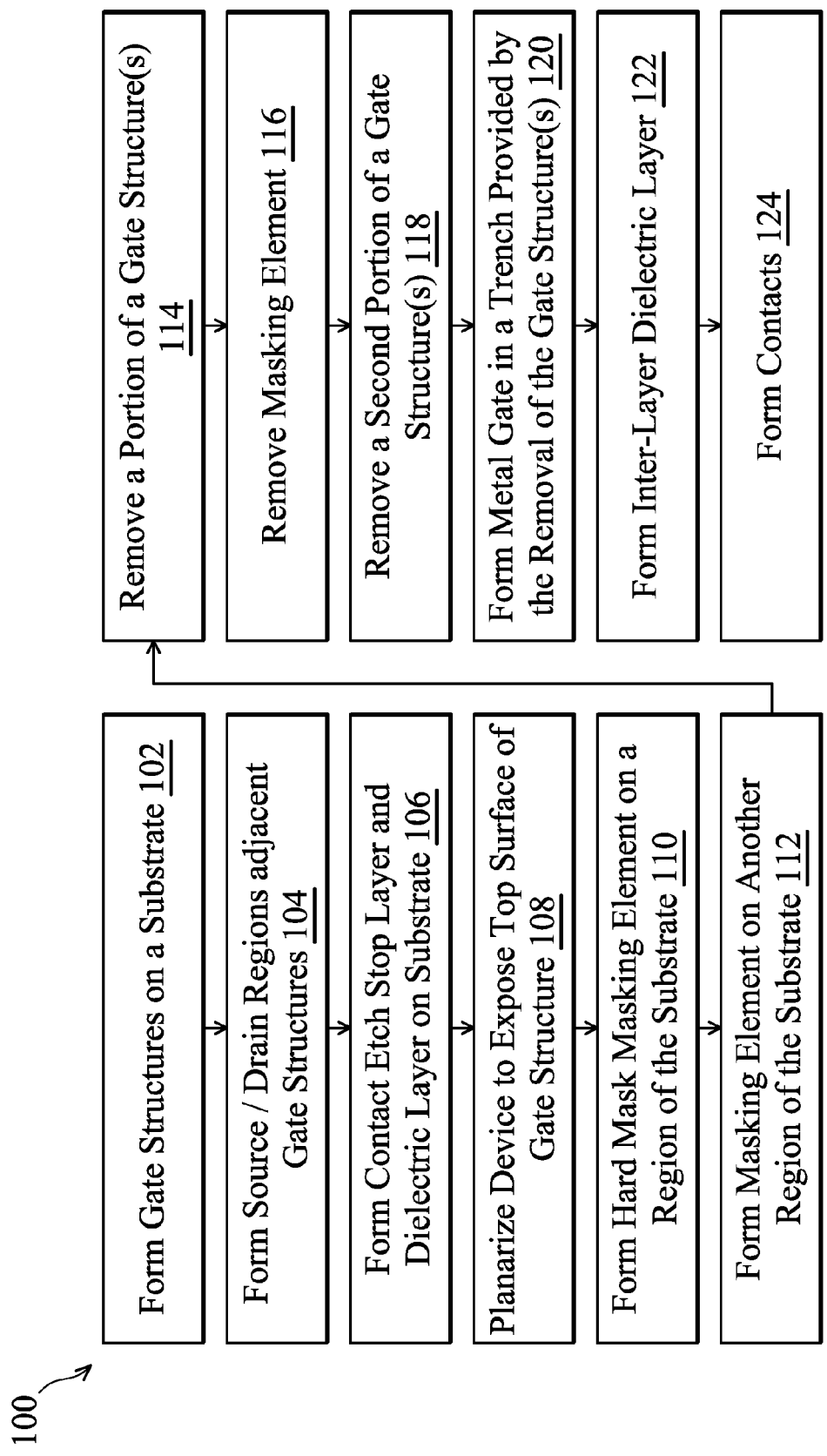
FIG. 1 is a flow chart illustrating an embodiment of a method of fabricating a semiconductor device according to one or more aspects of the present disclosure.

Illustrated in FIG. 1 is a flow chart of a method 100 of fabricating a semiconductor device. The method 100 may be used to implement a replacement gate methodology on a hybrid semiconductor device. A hybrid semiconductor device includes a plurality of differently configured devices having differently configured gate structures (e.g., gate stacks having different layer compositions, thicknesses, etc). FIGS. 2-17 are cross-sectional views of a device 200 fabricated according to the method 100 of FIG. 1.

It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the doping methods described herein.

It is also understood that parts of the semiconductor device 200 may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected. The device 200 illustrates a single gate structure in each of four regions of the substrate; this is provided for simplification and ease of understanding and does not necessarily limit the embodiment to any number of gate structures, any number of regions, or any configuration of structures of regions.

The device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at block 102 where a plurality of gate structures is formed on a semiconductor substrate. The plurality of gate structures may include a dielectric layer, a metal gate layer (e.g., work function material), and a dummy layer. In an embodiment, the dummy layer is polysilicon, however, other compositions may be possible. The dummy layer may be a sacrificial layer for at least one of the transistors to be formed on the substrate. The dummy layer may be the resulting gate electrode for at least one of the transistors to be formed on the substrate. The gate structures may be formed in different regions of the substrate, for example, regions defined for NFET devices, regions defined for PFET devices, regions defined for high-resistance transistors, regions defined for non-functional transistors (also known as dummy transistors), and/or other suitable regions defined by a design for an integrated circuit.

Figure 2:
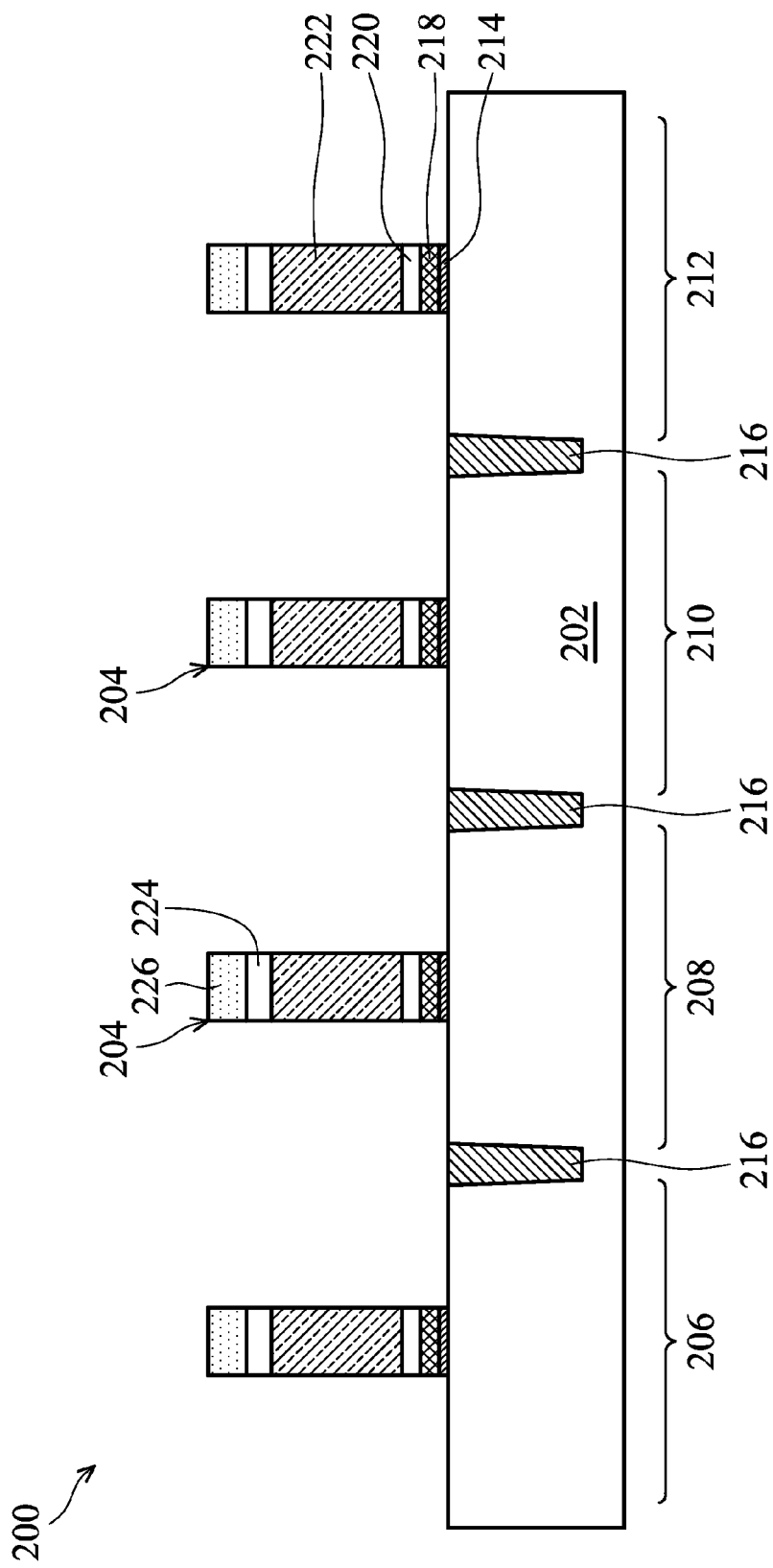
FIGS. 2-17 illustrate cross-sectional views of an embodiment of a semiconductor device fabricated according to one or more steps of the method of FIG. 1.

Referring to the example of FIG. 2, a semiconductor device 200 having a substrate 202 and a plurality of gate structures 204 disposed thereon is illustrated.

The substrate 202 may be a silicon substrate. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI).

The substrate 202 includes a first region 206, second region 208, third region 210, and fourth region 212. Isolation structures 216 interpose the regions. In an embodiment, the first region 206 is an n-type field effect transistor region. In an embodiment, the second region 208 is a p-type field effect transistor region. In an embodiment, the third region 210 is a high-resistance resistor region. In an embodiment, the fourth region 212 is a dummy transistor (e.g., non-functional transistor) region. The fourth region 212 may provide gate structures on conductive, semiconductive, or insulating layers (e.g., silicon oxide) portions of the substrate. It is noted that these regions are exemplary only and not intended to be limiting in type, configuration, arrangement, or the like.

The isolation structures 216 may be formed of silicon oxide, silicon nitride, silicon oxynitride, fluoride-doped silicate glass (FSG), a low-k dielectric material, and/or other suitable insulating material. The isolation structures 216 may be shallow trench isolation (STI) features. In an embodiment, the isolation structures are STI features and are formed by etching trenches in the substrate 202. The trenches may then be filled with isolating material, followed by a chemical mechanical polish (CMP). Other isolation structures 216 such as field oxide, LOCOS, and/or other suitable structures are possible. The isolation structures 216 may include a multi-layer structure, for example, having one or more liner layers.

The gate structures 204 include an interfacial layer 214, a gate dielectric layer 218, and a metal gate layer 220. A dummy layer 222 (e.g., polysilicon) is disposed on the metal gate layer 220. In embodiments, the gate structures 204 may further include a capping layer, for example, interposing the gate dielectric layer 218 and the metal gate layer 220.

The interfacial layer 214 may include a dielectric material such as silicon oxide layer ($SiO_2$) or silicon oxynitride (SiON). The interfacial layer 214 may be formed by chemical oxidation, thermal oxidation, atomic layer deposition (ALD), CVD, and/or other suitable dielectric.

The dielectric layer 218 may be a gate dielectric layer. The dielectric layer 218 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer 218 may be formed by atomic layer deposition (ALD) and/or other suitable methods.

The metal gate layer 220 includes a work function metal. A work function value is associated with the material composition of the work function layer, and thus, the material of the first work function layer is chosen to tune its work function value so that a desired threshold voltage Vt is achieved in the device that is to be formed in the respective region. In an embodiment, the metal layer 220 is an n-type work function metal. Exemplary n-type work function metals that may be included in the gate structure 204 include Ti, Ag, TaAl, TaAlC, TiAlN, TaC, TaCN, TaSiN, Mn, Zr, other suitable n-type work function materials, or combinations thereof. The metal gate layer 220 may be deposited by CVD, PVD, and/or other suitable process.

The polysilicon layer 222 may be formed by suitable deposition processes such as, for example, low-pressure chemical vapor deposition (LPCVD) and plasma-enhanced CVD (PECVD). In an embodiment, a hard mask layer is disposed on the gate structures. In a further embodiment, the hard mask layer includes a first layer 224 and a second layer 226. In an example, the first layer 224 includes silicon oxide. In a further example, the second layer 226 includes silicon nitride.

The method 100 then proceeds to block 104 where source/drain regions are formed. The source/drain regions may include the introduction of suitable dopant types: n-type or p-type dopants. The source/drain regions may include halo or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques. In a further embodiment, the source/drain activation process may include a rapid thermal anneal, for example, at a temperature of approximately 1010 Celsius (C). Referring to the example of FIG. 3, a source/drain implantation 304 is illustrated. The source/drain implantation 304 may be referred to as a halo or LDD implant. Referring to the example of FIG. 5, a source/drain implantation 502 is illustrated.

Figure 3:
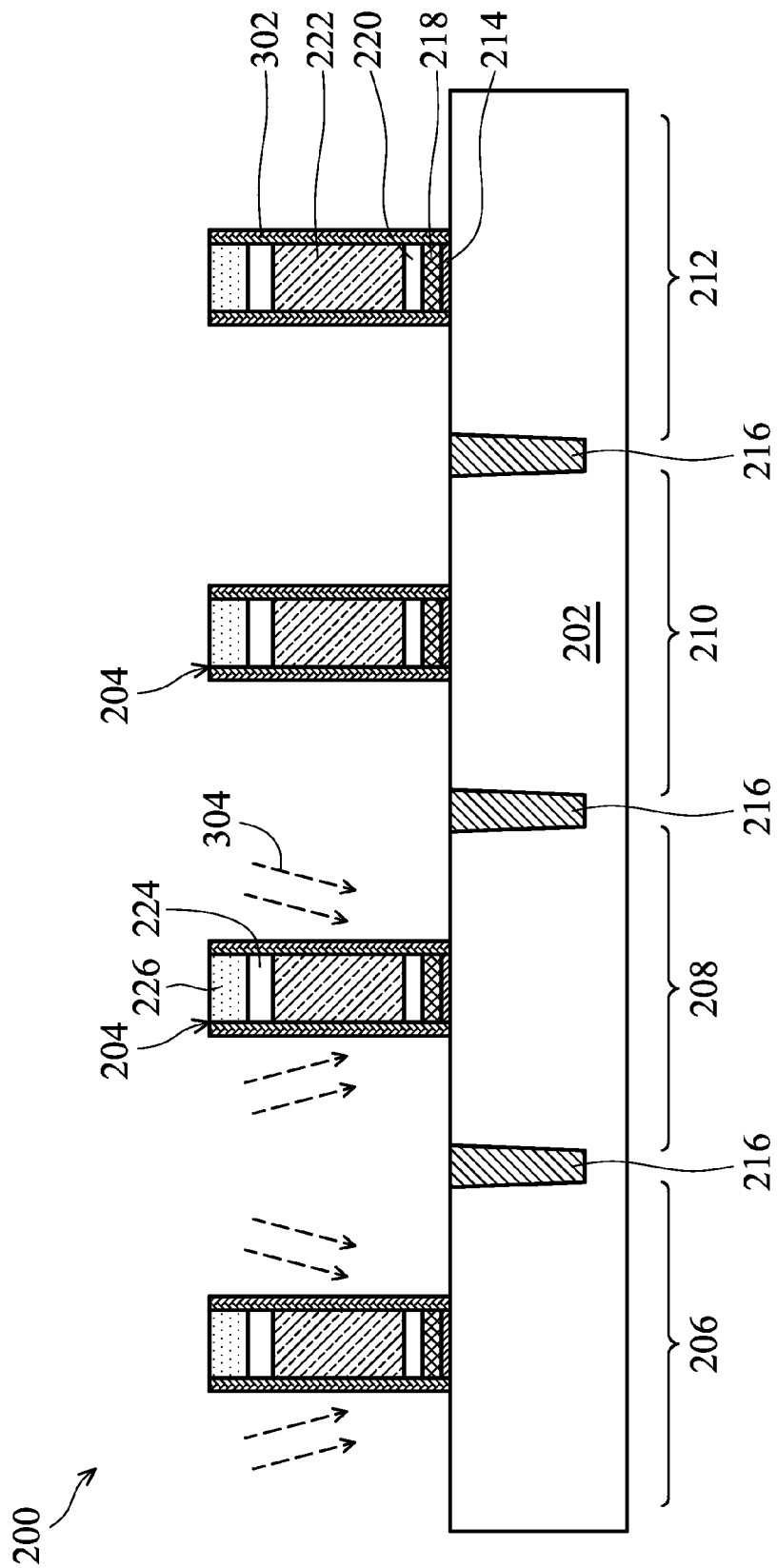

In embodiments, a seal layer is formed on the gate structure. The seal layer may be formed prior to a source/drain formation such as a halo or low-dose drain (LDD) implant. In an embodiment, the seal layer includes silicon nitride. Referring to the example of FIG. 3, a seal layer 302 is formed on the gate structures 204. In an embodiment, the seal layer 302 has a thickness of approximately 30 Angstroms (A). Again, FIG. 3 is also illustrative of a halo/LDD implant 304.

In embodiments, spacer elements may be formed abutting the sidewalls of the gate structures prior to or after the formation of the source/drain regions (or portions thereof). The spacer elements may be formed by depositing a dielectric material followed by an isotropic etching process, however other embodiments are possible. In an embodiment, the spacer elements include silicon oxide, silicon nitride, and/or other suitable dielectrics. The spacer elements may include a plurality of layers. For example, in an embodiment, the spacer elements include approximately 30 A of oxide and approximately 250 A of silicon nitride.

Figure 4:
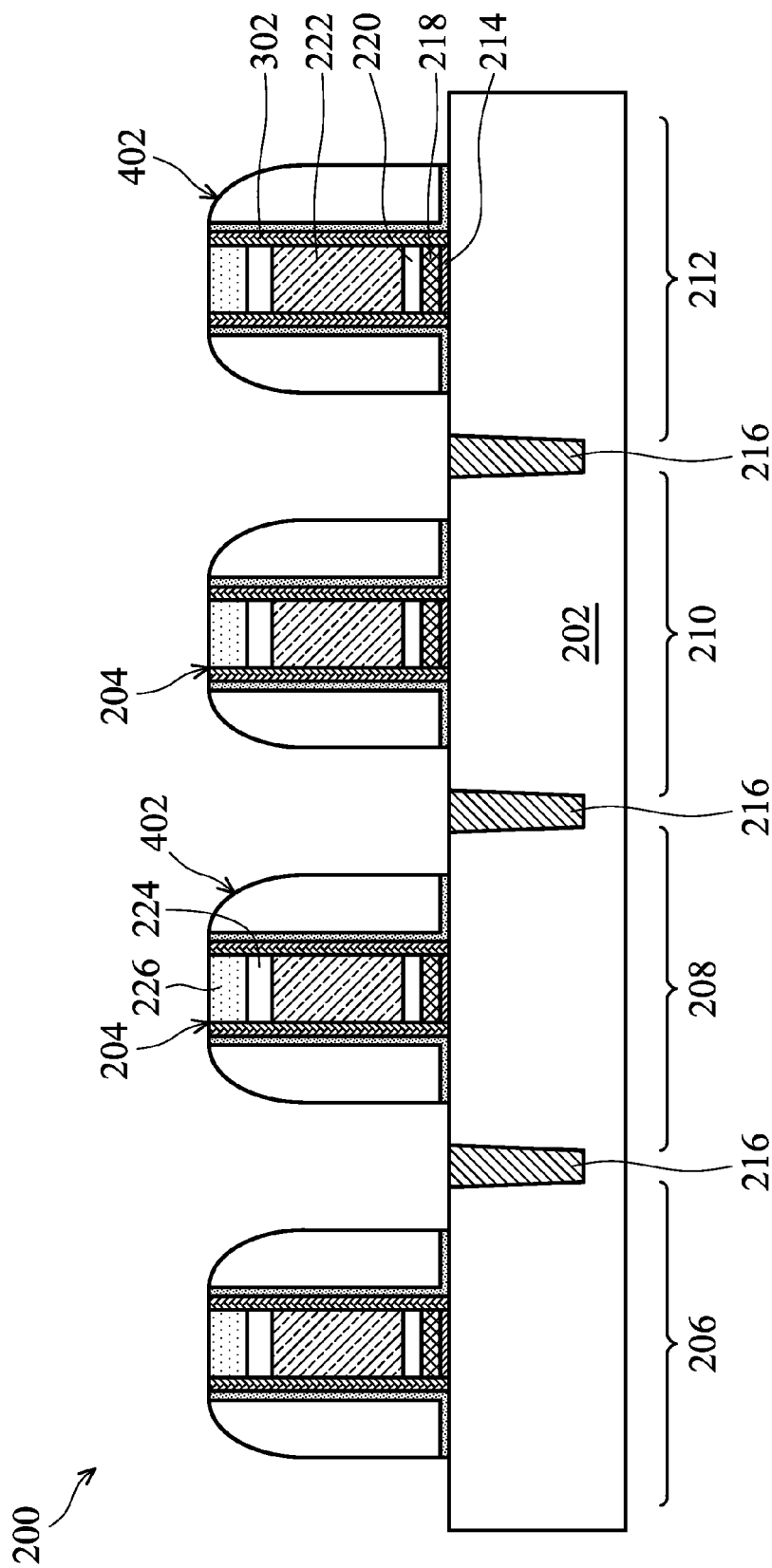
Figure 5:
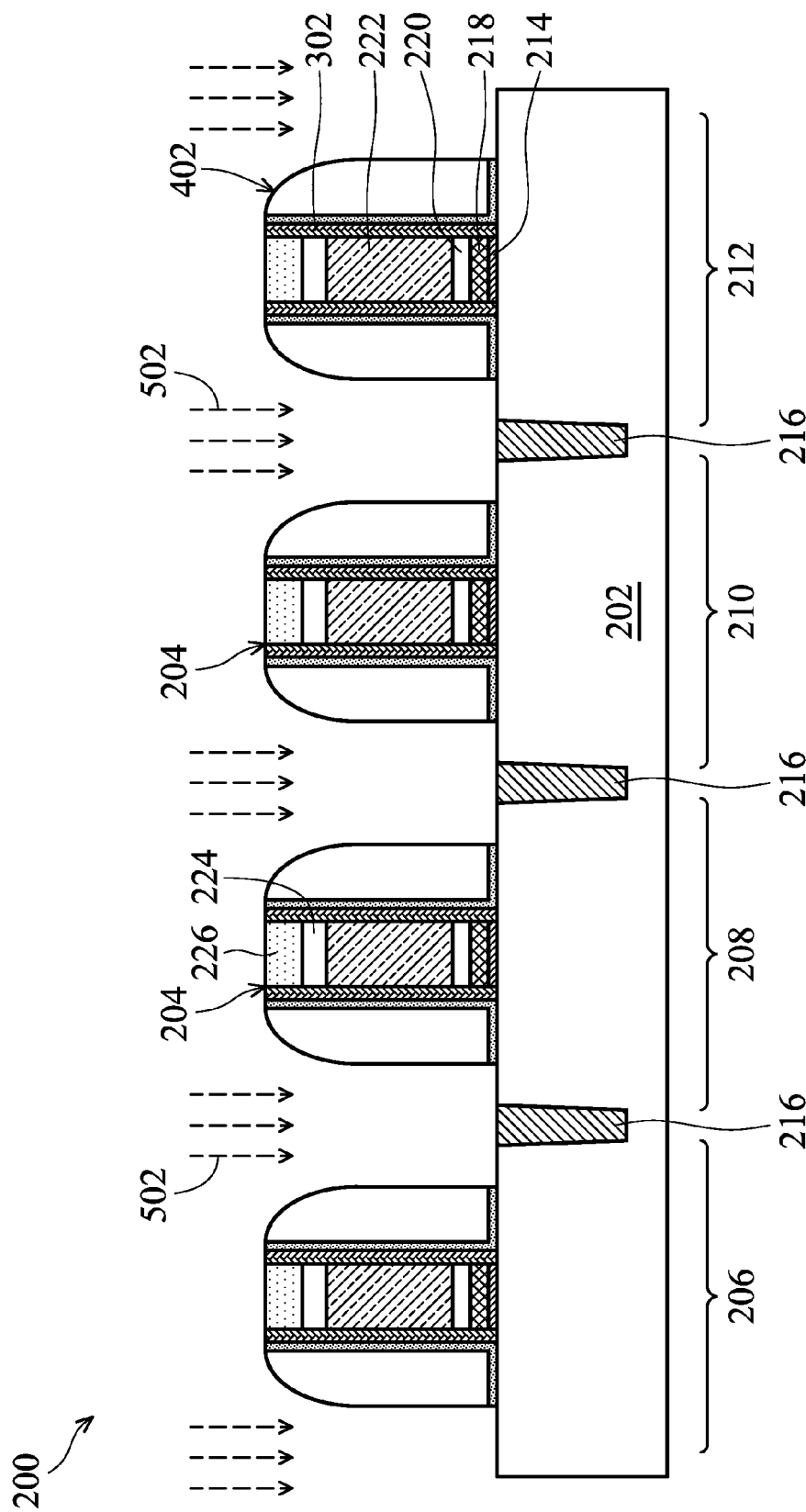
Figure 6:
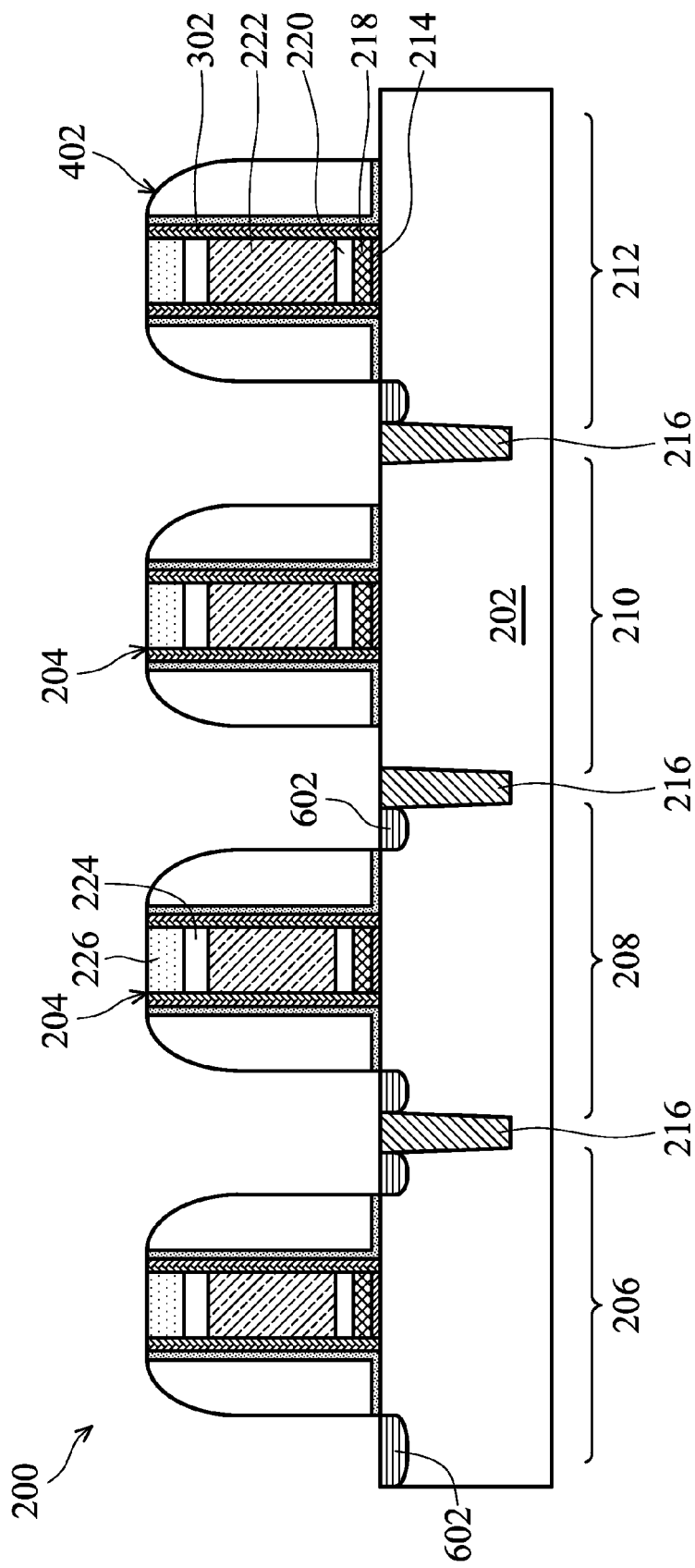

Referring to the example of FIG. 4, spacer elements 402 are formed abutting the sidewalls of the gate structures 204. The spacer elements 402 may also be referred to as main spacer walls. The spacer elements 402 may include a liner layer (e.g., oxide) having a uniform thickness and an overlying main spacer layer (e.g., nitride) such as a D-shaped spacer.

In an embodiment, block 104 includes the silicidation of the doped source/drain regions. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer. In an embodiment, nickel silicide is formed by depositing approximately 400 A of nickel onto the substrate. Referring to the example of FIG. 6, the source/drain regions formed as discussed above with reference to FIG. 5 are silicided to form silicide regions 602.

The method 100 then proceeds to block 106 where a contact etch stop layer (CESL) and/or intermediate dielectric layer are formed on the plurality of gate structures. Examples of materials that may be used to form CESL include silicon nitride, silicon oxide, silicon oxynitride, and/or other materials known in the art. The CESL may be formed by PECVD process and/or other suitable deposition or oxidation processes. The dielectric layer may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer may be deposited by a PECVD process or other suitable deposition technique. Referring to the example of FIG. 8, a CESL 802 and dielectric 804 are disposed on the substrate 202.

Figure 7:
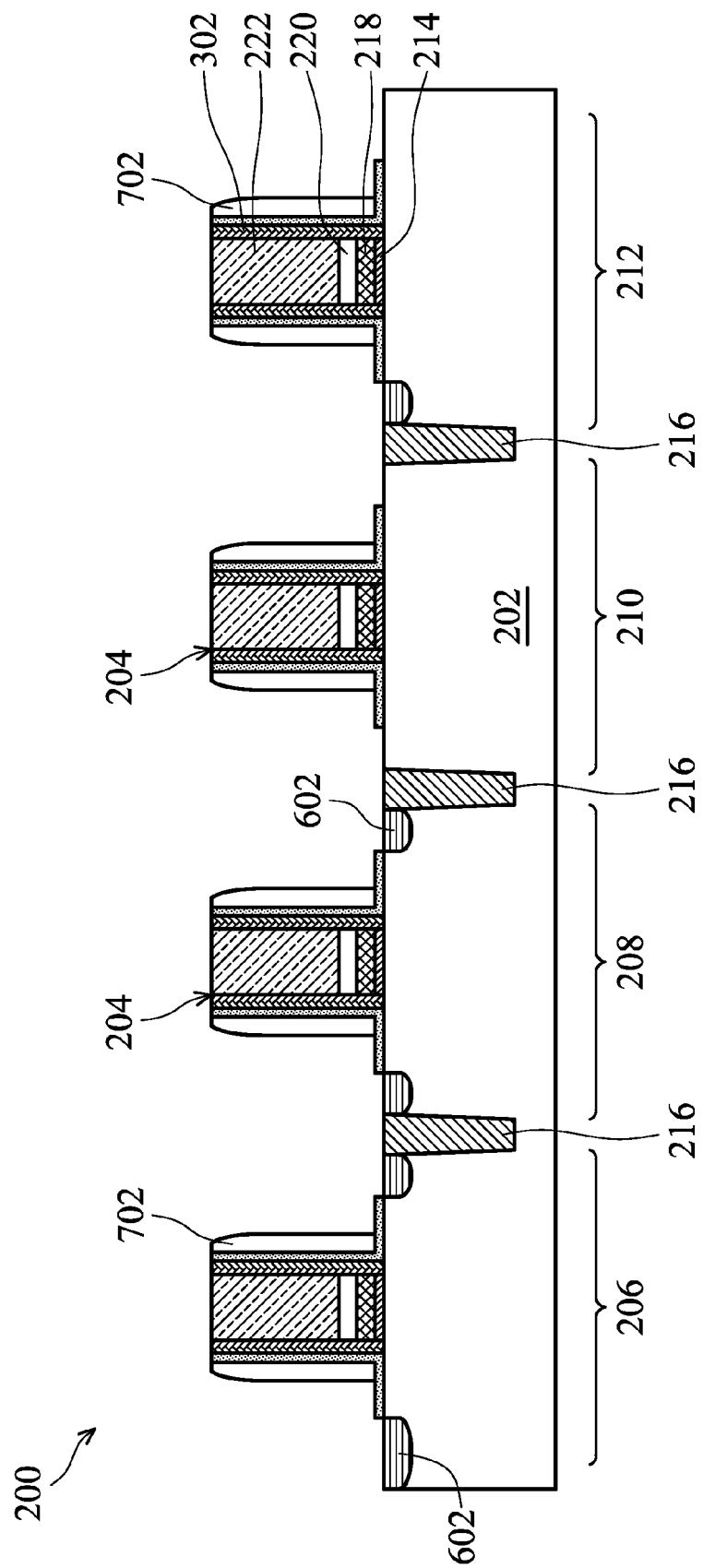
Figure 8:
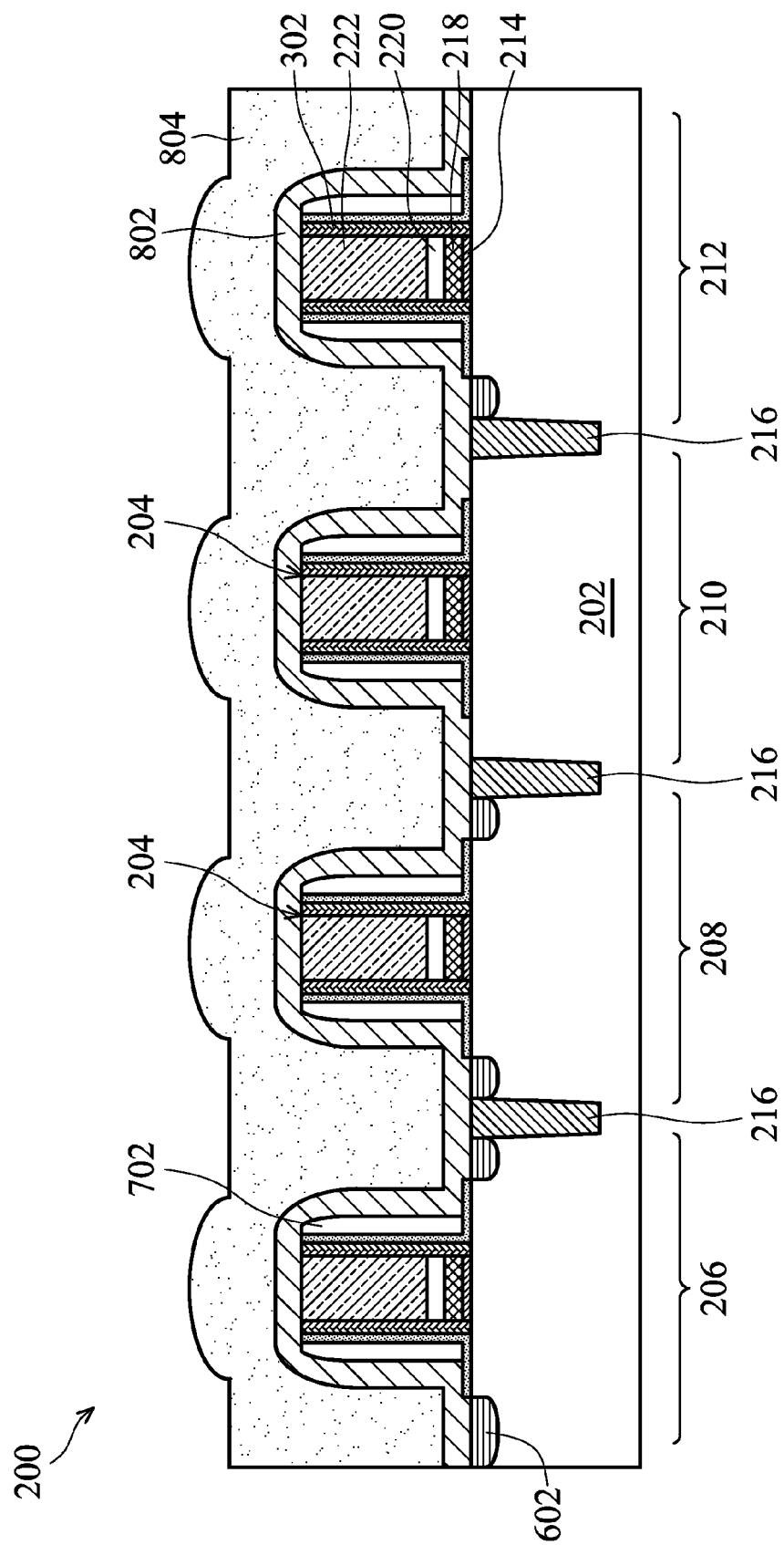
Figure 9:
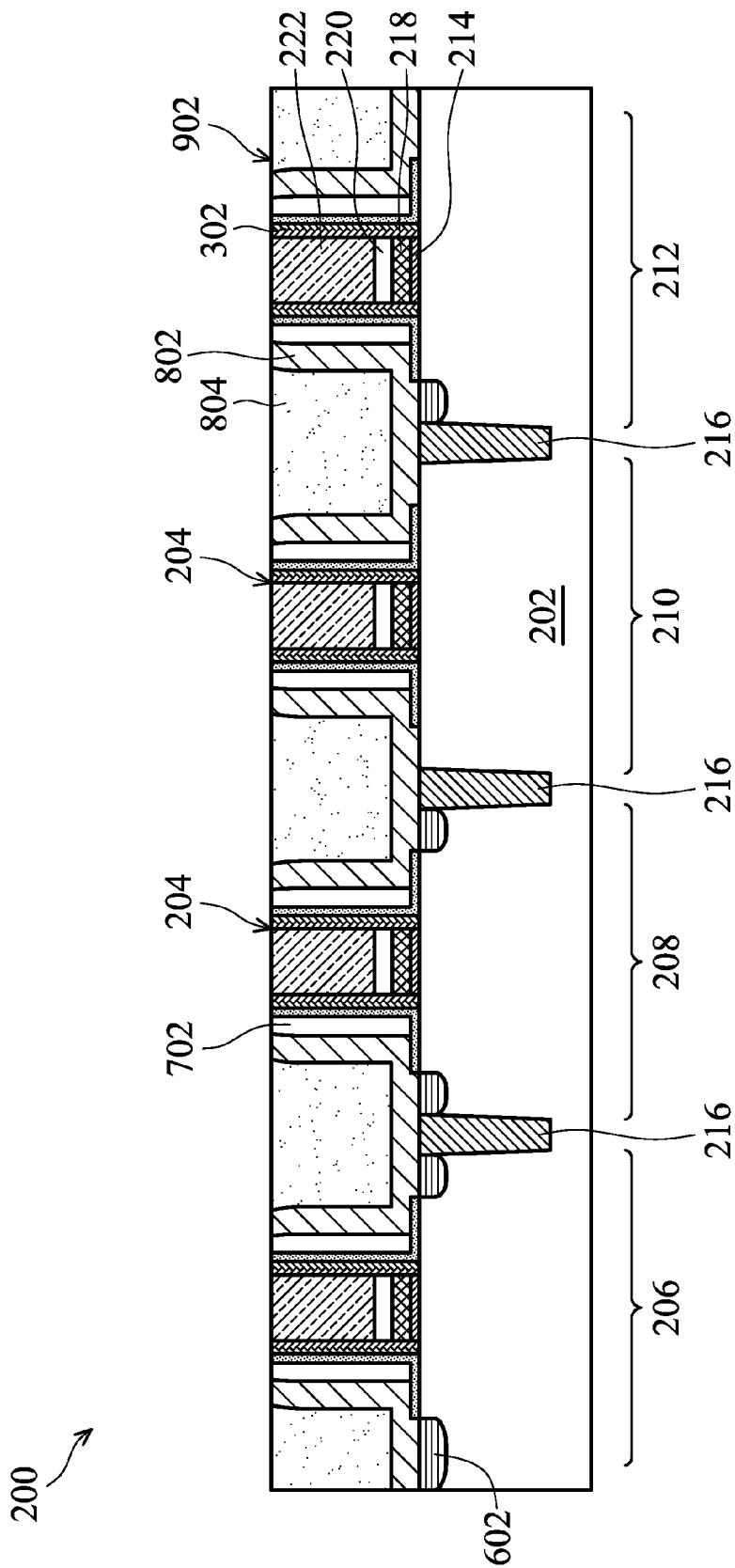

In an embodiment, prior to the formation of the CESL and/or intermediate dielectric layer, a partial removal of the spacer elements and/or hard mask material may be performed. The partial removal of the spacer elements may be provided by suitable processes such as, for example, wet etch processes including $H_3PO_4$ at an elevated temperature. In an embodiment, $H_3PO_4$ at approximately 120 C is used to remove a portion of the of spacer elements (e.g., SiN). In an embodiment, the hard mask layer(s) are removed by a dry etching process. Referring to the example of FIG. 7, illustrated are spacer elements 702, which are reduced in thickness from spacer elements 402 (FIG. 4) and the hard mask layers 224 and 226 have been removed. The CESL 802 and/or dielectric 804 may be formed on the spacer elements 702.

The method 100 then proceeds to block 108 where a planarization process is performed to expose a top surface of a gate structure. The planarization process may include a chemical mechanical planarization (CMP). Referring to the example of FIG. 9, a planarization process has been performed to form surface 902 and expose the polysilicon layer 222 of the gate structures 104.

The method 100 then proceeds to block 110 where a hard mask masking element is formed on a region of the substrate, for example, a region providing a first type of transistor. In an embodiment, a blanket hard mask layer is formed and subsequently patterned using suitable lithography and etching (e.g., dry etching) techniques. In an embodiment, the hard mask layer includes TiN. In one embodiment, the hard mask layer is approximately 20 Angstroms (A) thickness. The hard mask masking element may be formed on region of the substrate providing a specific transistor type, such as a high-resistance resistor.

Figure 10:
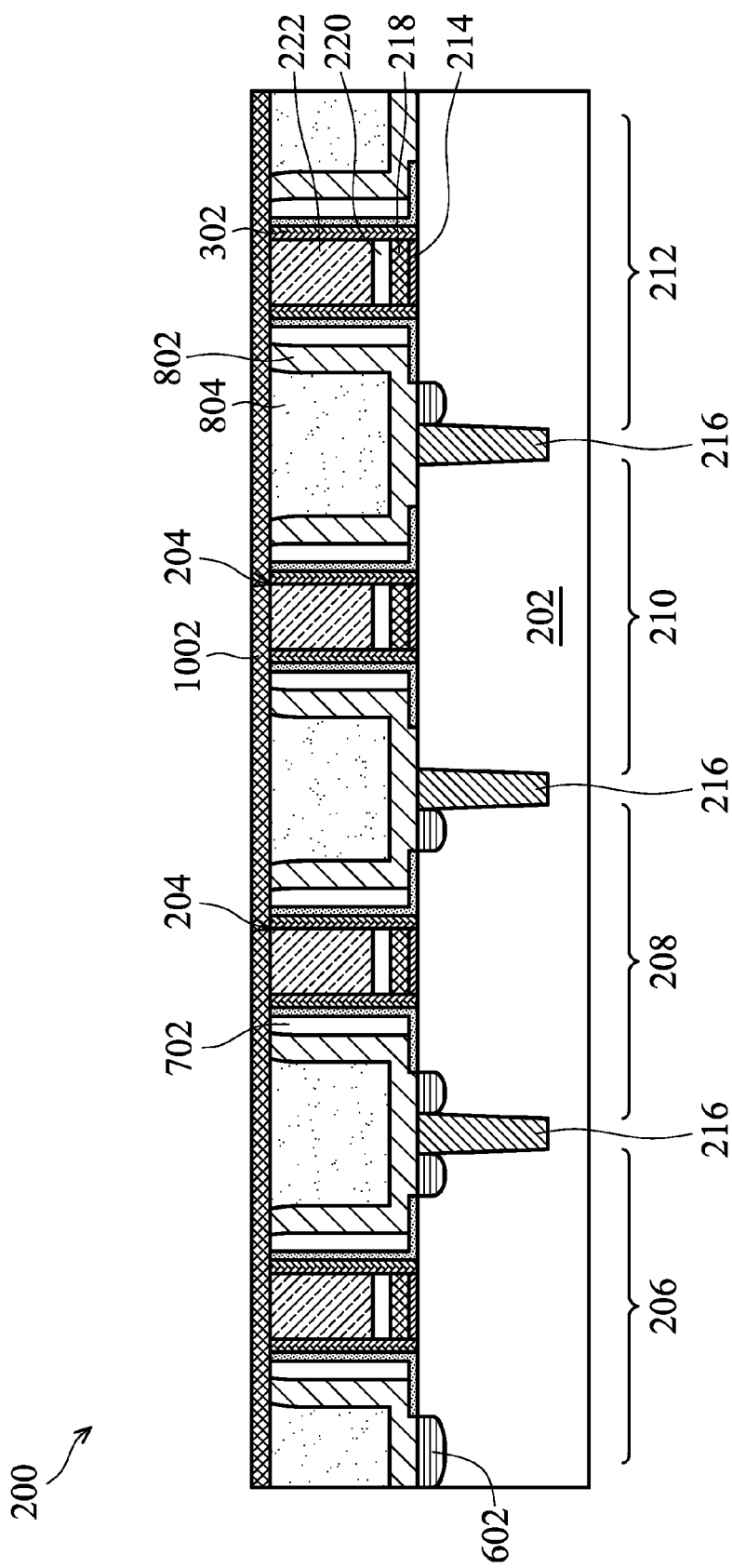
Figure 11:
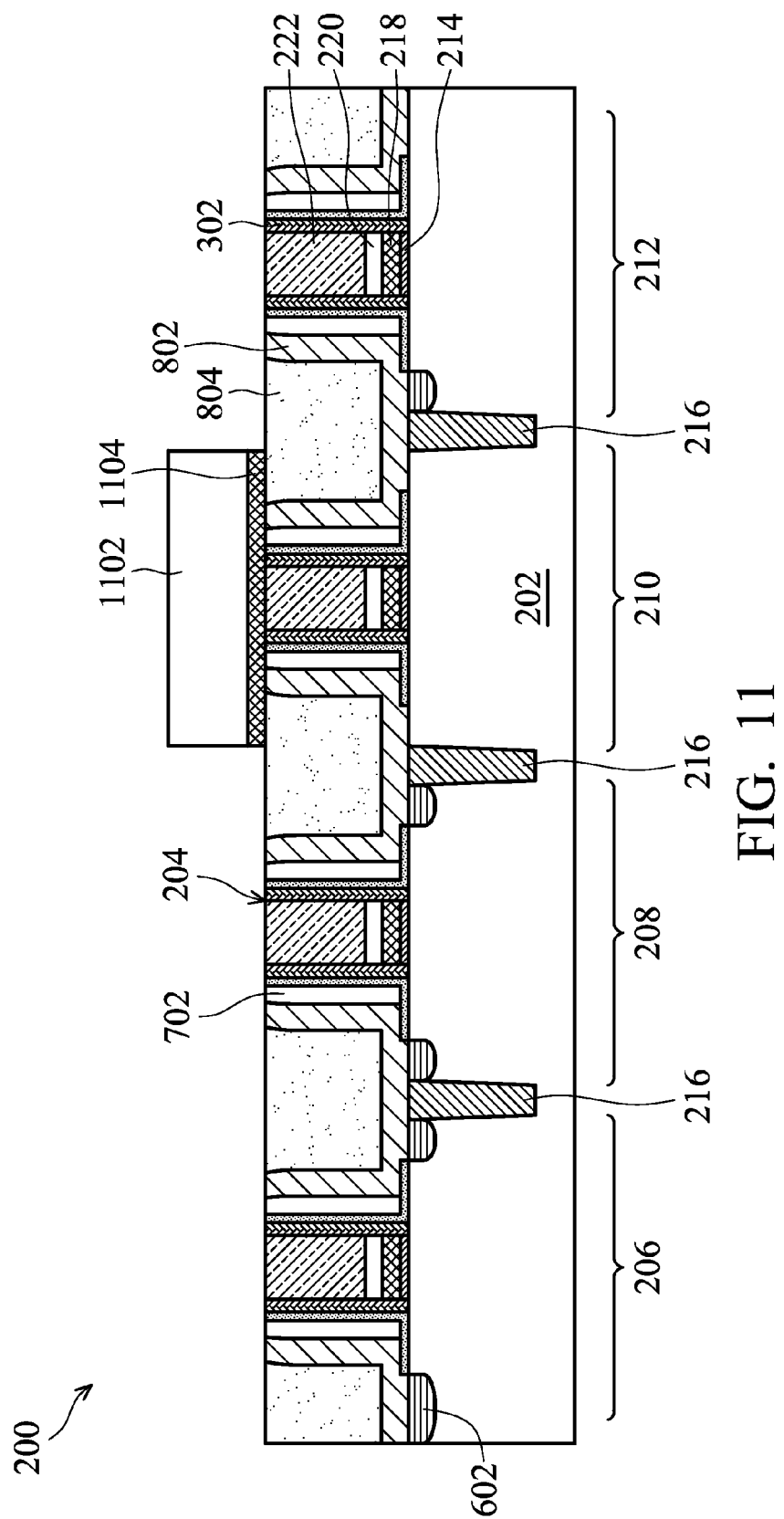

Referring to the example of FIG. 10, a layer of hard mask material 1002 is formed on the substrate 202. The hard mask layer 1002 is patterned to form masking element 1104, as illustrated in FIG. 11. The hard mask masking element 1104 may be formed using a photoresist masking element 1102. In an embodiment, masking element 1104 is disposed on the third region 208 of the substrate 202. In a further embodiment, the masking element 1104 is formed over a region of the substrate 202 providing high-resistance resistor. However, other embodiments having differing functionality of the transistor associated with the masked gate structure are possible.

The method 100 then proceeds to block 112 where a masking element is formed on another region of the substrate, for example, different than the region defined by the masking element of block 110. In an embodiment, the masking element of block 112 is formed on a region of the substrate including a second type of transistor. In a further embodiment, the masking element is formed on a region of the substrate having one of n-type field effect transistors and p-type field effect transistors. The masking element may include photoresist patterned using suitable processes such as exposure and development. Referring to the example of FIG. 12, a photoresist feature 1202 is disposed on the substrate 202. The photoresist feature 1202 provides a masking element protecting a first region 206 of the substrate 202. In an embodiment, the photoresist feature 1202 overlies gate structures associated with NFET devices.

The method 100 then proceeds to block 114 where a portion of a layer of a gate structure(s) is removed. In an embodiment, a portion of the polysilicon layer of the gate structures in one or more regions of the substrate is removed. In an embodiment, a portion of the polysilicon layer of the gate structures associated with a PFET and/or dummy gate structure are removed. The polysilicon layer may be reduced in thickness, in the given regions, for example, by approximately 50%. The polysilicon layer may be etched using suitable wet etch, dry etch, plasma etch, and/or other processes.

Figure 12:
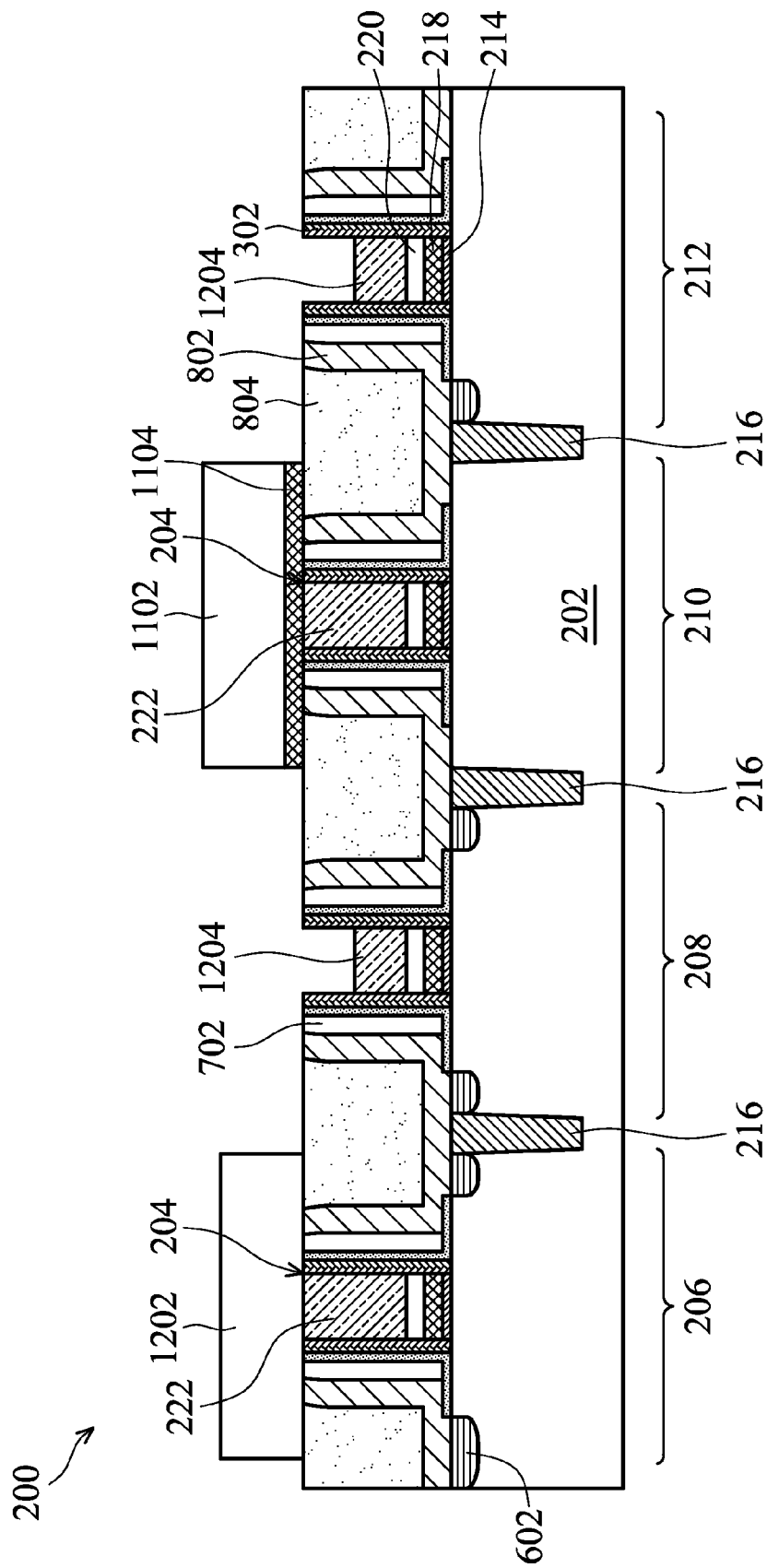
Figure 13:
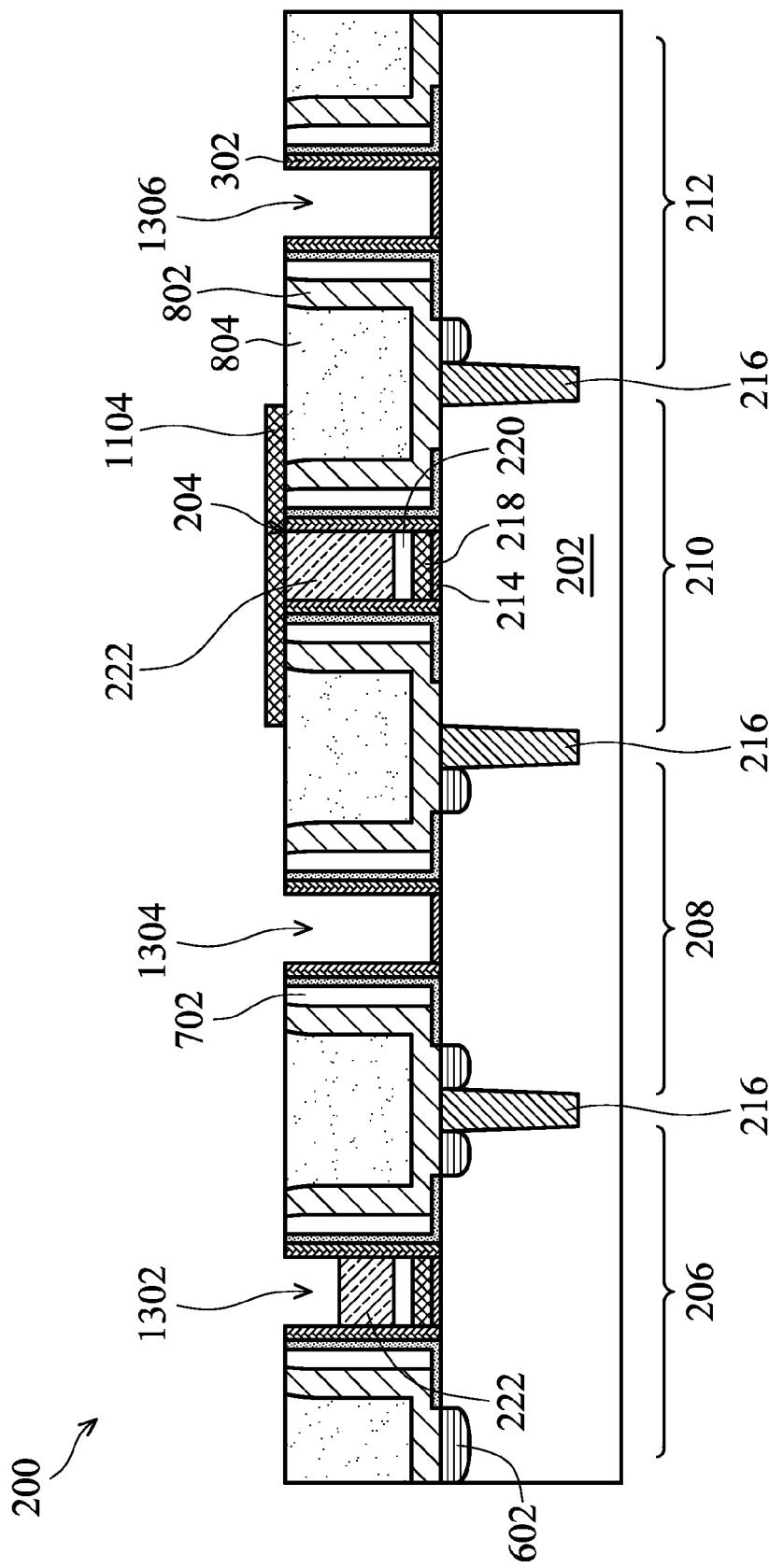

Referring to the example of FIG. 12, the polysilicon layer 222 has been reduced in thickness in the gate structures 204 provided in the second region 208 and the fourth region 212 of the substrate 202 to provide polysilicon layer 1204. In an embodiment, the second region 208 provides a gate structure associated with a PFET device. In an embodiment, the fourth region 212 provides a gate structure associated with a dummy device.

The method 100 then proceeds to block 116 where a masking element is removed. The masking element described above with reference to block 112 (e.g., photoresist) may be stripped from the substrate. In an embodiment, the hard mask masking element, described above with reference to block 110 may remain on the substrate. Referring to the example of FIG. 13, the masking elements 1202 and 1102 (see FIG. 12) have been removed from the substrate 202. The removal of the masking elements exposes the gate structure in the first region 206, second region 208, and fourth region 212 of the substrate 202.

The method 100 then proceeds to block 118 where a portion of a gate structure(s) is removed to form a trench(es). In an embodiment, the remaining polysilicon layer of the gate structures in one or more regions of the substrate may be removed, and the polysilicon layer of the gate structure in another region of the substrate may be reduced in thickness. The hard mask masking element may protect a gate structure in yet another region of the substrate. Referring to the example of FIG. 13, the gate structure 204 in the first region 206 of the substrate has trench 1302 formed from the partial removal of the polysilicon layer 222. The gate structure 204 in the second region 208 of the substrate has trench 1304 formed from the removal of the partial polysilicon layer 1204 (e.g., the entire removal of the polysilicon layer 222 in the designated region). The gate structure 204 in the fourth region 212 of the substrate has trench 1306 formed from the removal of the partial polysilicon layer 1204 (e.g., the entire removal of the polysilicon layer 222 in the designated region). It is noted that after and/or in situ with the removal of the entire polysilicon layer 222, the metal layer 220 and the dielectric layer 218 are exposed. The metal layer 220 and the dielectric layer 218 may also be removed (see trenches 1304 and 1306). In an embodiment, the interfacial layer 216 remains in the trenches 1304 and/or 1306, however other embodiments are possible.

The method 100 then proceeds to block 120 where a metal gate is formed in a trench provided by the blocks 118 and/or 112 of the method 100. The metal gate fondled may also include gate dielectric layer(s), capping layer(s), fill layer(s), and/or other suitable layers. A work function metal layer included in the metal gate may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, and/or other suitable process. In an embodiment, the metal gate formed is a p-type metal gate including a p-type work function layer A dielectric layer of the metal gate structure may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The dielectric layer may be the same as or different composed than the dielectric layer formed in the gate structure described above in block 102.

A fill layer of the metal gate structure may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings.

Figure 14:
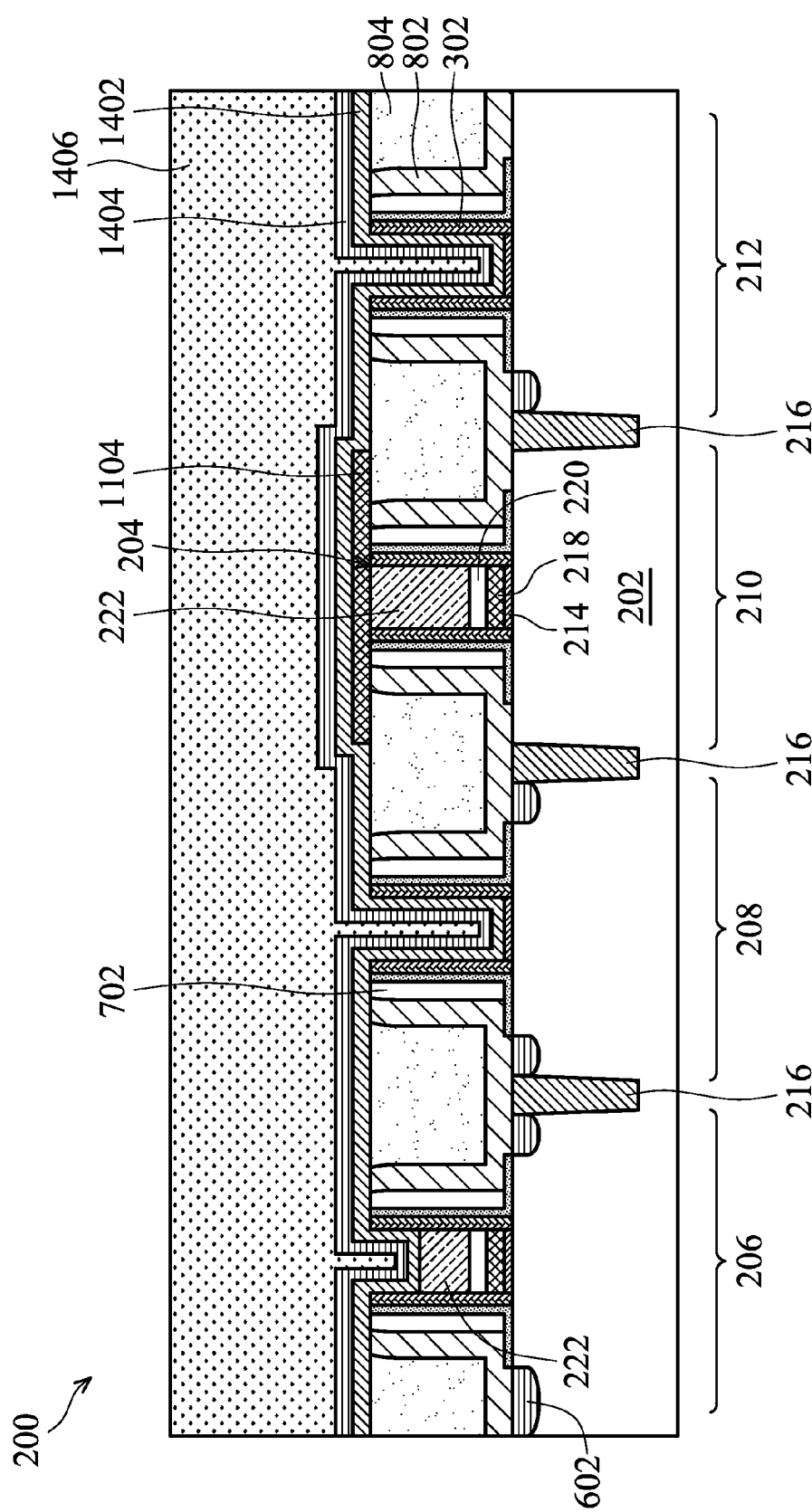

Referring to the example of FIG. 14, a gate dielectric layer 1402 is formed on the substrate. The gate dielectric layer 1402 may be a high-k dielectric as discussed above. A metal layer 1404 is formed on gate dielectric layer 1402. The metal layer 1404 may be a work function metal layer. In an embodiment, the metal layer 1404 has an opposite conductivity type (n-type or p-type) from the metal gate layer 220. In an embodiment, the metal layer 1404 is a p-type work function layer. A fill metal layer 1406 is formed on the metal layer 1404, filling the remaining of the trenches (trenches 1302, 1304, and 1306 of FIG. 13).

After forming the gate dielectric layer 1402, the metal layer 1404 and the fill layer 1406, a planarization process may be performed. Referring to the example of FIG. 15, the device of FIG. 14 has been planarized removing the metal gate layers from the surface of the dielectric layer 804.

Thus, a gate structure 1502 is formed in the first region 206 of the substrate 202. The gate structure 1502 includes the interfacial layer 214, the dielectric layer 218, the metal layer 220, the polysilicon layer 222, the dielectric layer 1402, the metal layer 1404, and the fill layer 1406. In an embodiment, the metal gate layer 220 provides the work function value for the gate structure 1502. In an embodiment, the gate structure 1502 provides a gate for a NFET device.

Further, a gate structure 1504 is formed in the second region 208 of the substrate 202. The gate structure 1504 includes the interfacial layer 214, the dielectric layer 1402, the metal layer 1404, and the fill layer 1406. In an embodiment, the metal layer 1404 provides the work function value for the gate structure 1504. In an embodiment, the gate structure 1504 provides a gate for a PFET device.

Further still, a gate structure 1506 is formed in the third region 210 of the substrate 202. The hard mask layer 1104 may be removed by planarization process. The gate structure 1506 includes the interfacial layer 214, the dielectric layer 218, the metal layer 220, and the polysilicon layer 222. In an embodiment, the gate structure 1506 provides a gate for a high-resistance device.

Finally, a gate structure 1508 is formed in the fourth region 212 of the substrate 202. The gate structure 1508 includes the interfacial layer 214, the dielectric layer 1402, the metal layer 1404, and the fill layer 1406. In an embodiment, the gate structure 1508 provides a gate for a dummy device. It is noted that the gate structure 1504 may be formed on a conductive portion of the substrate 202 or on an isolation region.

Figure 15:
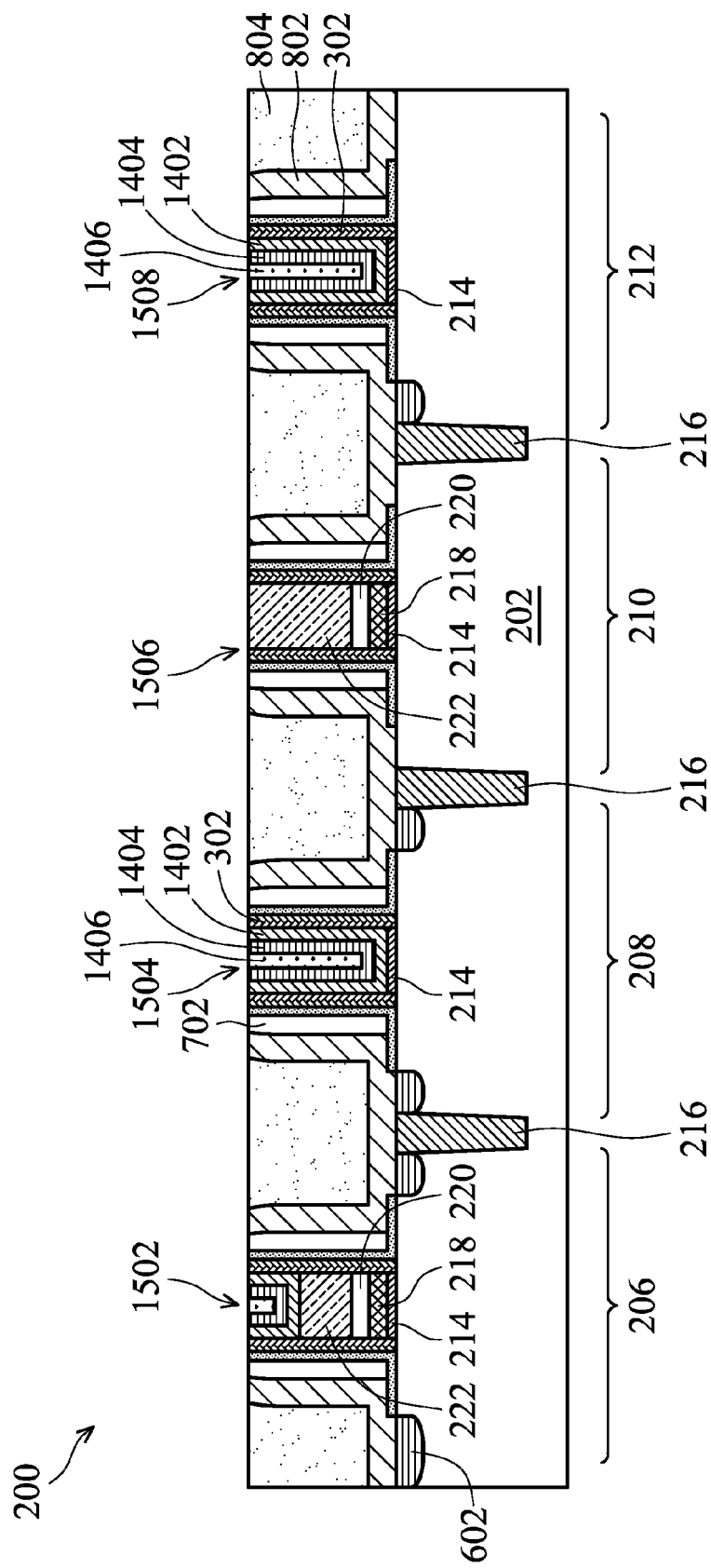

It is noted that one advantage of the method 100 can be illustrated by FIG. 15. During the planarization of the substrate 202, the gate structure 1508 provides for a suitable planarization stop, for example, reducing dishing effects due to the level of metal included in the gate structure 1508. For example, the downforce on the fourth region 212 of the substrate is countered by the strength or hardness of the materials provided in gate structure 1508.

The method 100 then proceeds to block 122 where an inter-layer dielectric (ILD) layer is formed. The ILD layer may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique. The ILD layer may be the same as or differently composed as the dielectric layer described above with reference to block 106. The ILD layer may be approximately 1450 A in thickness.

Figure 16:
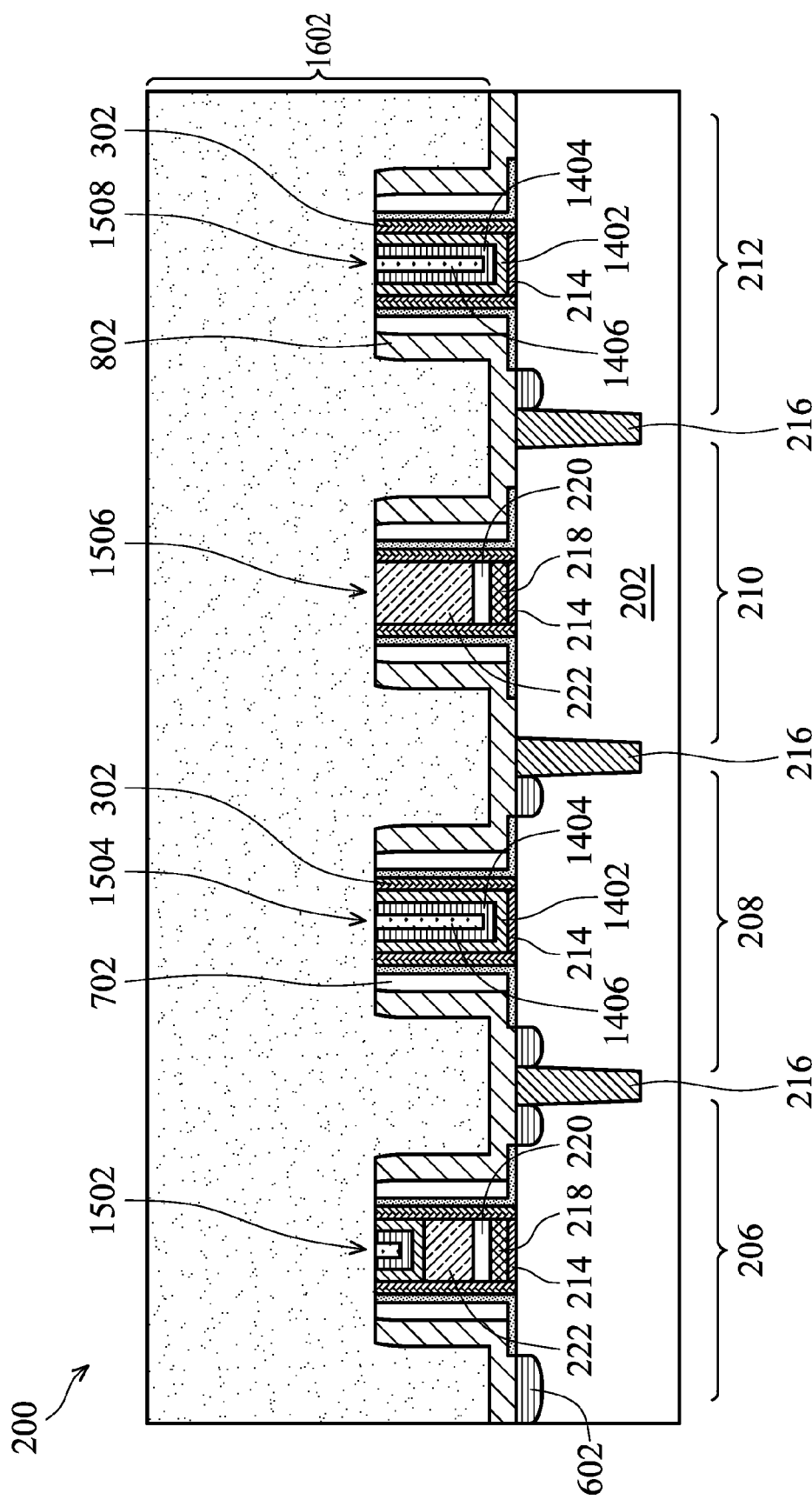
Figure 17:
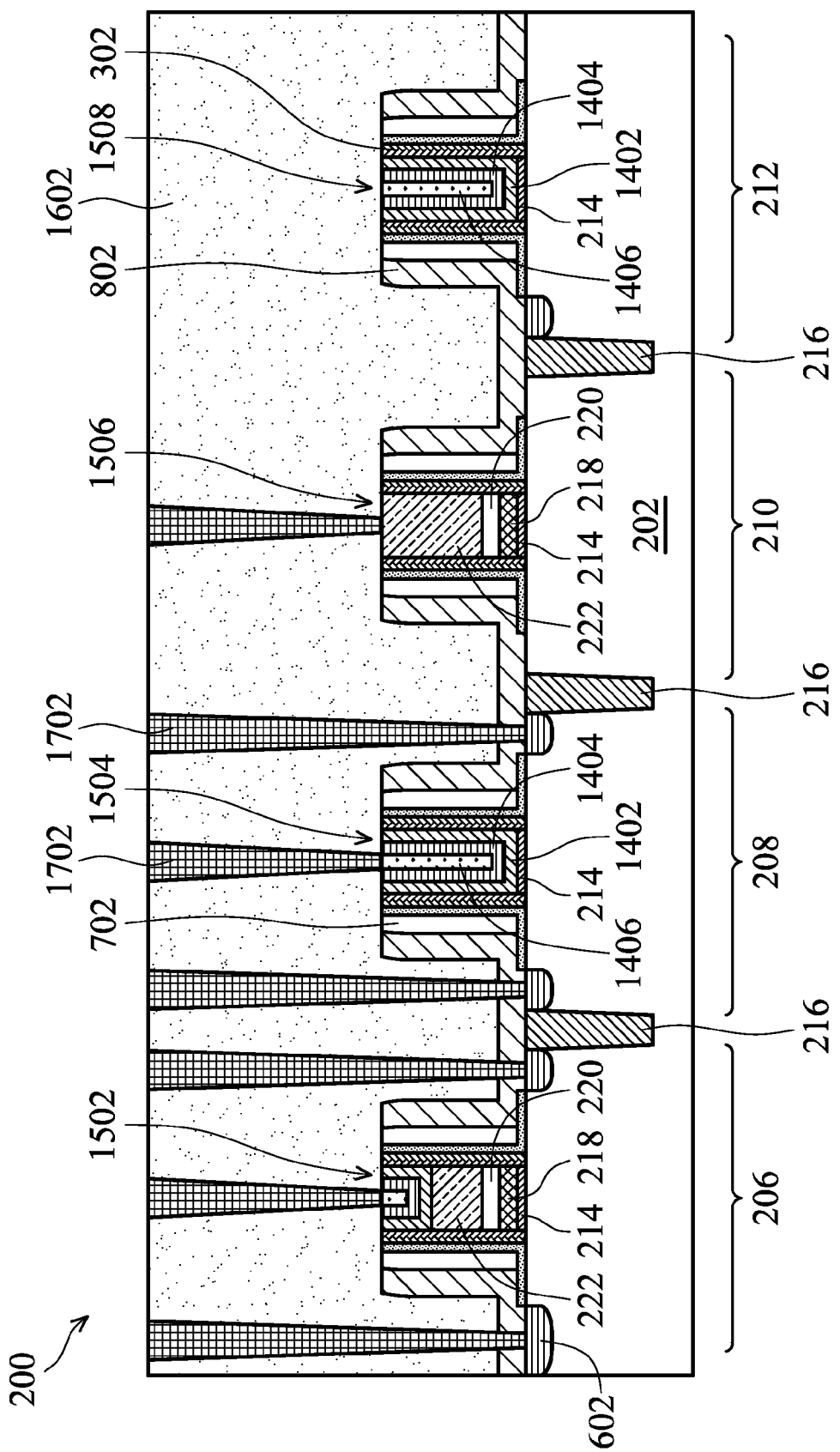

Referring to the example of FIG. 16, an ILD layer 1602 is provided on the substrate 202. The dielectric layer 1602 includes the dielectric layer 804 and dielectric material deposited after the planarization of the gate structures described above with reference to FIG. 15. The dielectric layer 1602 may include one or more dielectric material compositions. The ILD layer 1602 may be approximately 1450 A in thickness.

The method 100 then proceeds to block 124 where a contact is foamed to one or more of the features on the substrate 202. The contact may provide interconnection to one or more of the interconnect layers of a multilayer interconnect (MLI). The contact may include tungsten or other suitable conductive element. The contact may be formed by etching trenches or openings in the ILD layer and filling the trenches with a conductive material to form vias. Referring to the example of FIG. 17, a plurality of contacts 1702 are formed on the substrate 202. The contacts 1702 provide electrical connection to the source/drain regions and/or gate structures.

In summary, the methods and devices disclosed herein provide for a method and device having a hydrid (or differing) configuration of gate structures on a substrate. In an embodiment, a gate-first process is used to define one type of transistor (e.g., NFET) and a gate-last or replacement gate type methodology is used to define another type of transistor (e.g., PFET). In a further embodiment, a dummy gate (or non-functional gate) is provided following the gate-last or replacement gate type methodology used to define the second transistor type. Thus, in an embodiment, a PFET Dummy device is provided on the substrate. In doing so, the present disclosure offers embodiments which may provide advantages over prior art devices. For example, a gate height variation across the substrate and/or regions of the substrate, CMP induced over-polish, CMP induced under-polish (for example as seen in traditional replacement gate methodologies) may be improved using embodiments of the method of FIG. 1. The overall pattern density of one type of gate structure (e.g., PFET) may increase (active devices and dummy devices). In an embodiment, the overall pattern density of a device having a metal gate formed using a replacement gate methodology (e.g., a gate formed after the source/drain and/or by filling a trench provided by the removal of a first gate structure) is increased. It is understood that different embodiments disclosed herein offer different disclosure, and that they may make various changes, substitutions and alterations herein without departing from the spirit and scope of the present disclosure.

What is claimed is:

1. A method of fabricating a semiconductor device, comprising:
    forming a plurality of gate structures including a first gate dielectric layer, a first metal layer, and a dummy layer overlying the first gate dielectric layer and the first metal layer;
    forming a masking element on a third gate structure;
    removing a first portion of the dummy layer from a first gate structure and a second gate structure of the plurality of gate structures, while the masking element is disposed on the third gate structure;
    after removing the first portion of the dummy layer, removing the masking element from the third gate structure;
    after removing the masking element, removing a second portion of the dummy layer, wherein the second portion includes a remaining portion of the dummy layer in the first and second gate structures, wherein the removing the second portion of the dummy layer provides a first trench in the first gate structure, a second trench in the second gate structure, and a third trench in the third gate structure, wherein the first trench has a greater depth than the third trench; and
    forming a second gate dielectric layer and a second work function metal layer in the first trench and the second trench.

2. The method of claim 1, wherein the third gate structure is associated with an N-type field effect transistor.

3. The method of claim 2, wherein the first gate structure is associated with an P-type field effect transistor, and the second gate structure is a dummy gate structure.

4. The method of claim 1, further comprising:
    forming a hard mask layer and the masking element over a fourth gate structure of the plurality of gate structures prior to removing the first portion of the dummy layer.

5. The method of claim 1, wherein the removing the second portion of the dummy layer from the first and second gate structures further includes removing the first gate dielectric layer and the first metal layer of the first and second gate structures.

6. The method of claim 1, further comprising:
    wherein the second gate structure is a non-functional gate; and
    forming the second gate dielectric layer and the second work function metal layer in the third trench.

7. The method of claim 1, wherein the first metal layer is an n-type work function material and the second work function metal layer is a p-type work function material.

8. The method of claim 1, wherein the forming the second gate dielectric layer includes depositing a high-k dielectric material in the first and second trenches.

9. A method of semiconductor device fabrication, comprising:
    forming an n-type work function metal layer and an overlying polysilicon layer on a substrate;
    patterning the n-type work function layer and the polysilicon layer to form a first, second and third initial gate structures;
    forming a masking element on the first initial gate structure;
    performing a first etching of the polysilicon layer such that a first portion of the polysilicon layer is removed from the second initial gate structure and the third initial gate structure, while the masking element is disposed on the first initial gate structure;
    after removing the masking element on the first initial gate structure, performing a second etching of the polysilicon layer such that a second portion of the polysilicon layer is removed from the first initial gate structure to form a first trench and a remaining portion of the polysilicon layer is removed from the second and third initial gate structures to form a second trench and a third trench respectively;
    removing the n-type work function layer from the second and third initial gate structures;
    after removing the n-type work function layer, depositing a high-k gate dielectric layer in the first, second, and third trenches after the second etching of the polysilicon layer;
    forming a p-type work function metal layer in the first, second and third trenches on the high-k gate dielectric layer, and
    forming a fill metal layer in the first, second, and third trenches to form first, second and third gate structures respectively, thereby providing the first gate structure of an n-type field effect transistor, the second gate structure of a p-type field effect transistor, and the third gate structure associated with a dummy transistor.

10. The method of claim 9, wherein the patterning the n-type work function layer and the polysilicon layer further forms a fourth gate structure, and wherein the polysilicon layer is not removed from the fourth gate structure.

* * * * *